(12) United States Patent  (10) Patent No.: US 8,791,374 B1
Smith  (45) Date of Patent:  Jul. 29, 2014

(54) SNAP-IN ELECTRICAL CONNECTOR

(75) Inventor: Lawrence J. Smith, Stamford, CT (US)

(73) Assignee: Bridgeport Fittings, Inc., Stratford, CT (US)

( * ) Notice: Subject to any disclaimer, the term of this patent is extended or adjusted under 35 U.S.C. 154(b) by 366 days.

(21) Appl. No.: 13/211,061

(22) Filed: Aug. 16, 2011

Related U.S. Application Data

(63) Continuation-in-part of application No. 12/915,874, filed on Oct. 29, 2010.

(51) Int. Cl.
*H01L 23/495* (2006.01)

(52) U.S. Cl.
USPC ............................................. 174/530; 174/60

(58) Field of Classification Search
USPC .............. 174/530, 59–61, 531–533, 559–562
See application file for complete search history.

(56) References Cited

U.S. PATENT DOCUMENTS 7,390,980 B1 * 6/2008 Gretz ............................ 174/657
7,824,213 B1 * 11/2010 Korcz et al. .................... 439/552

* cited by examiner

*Primary Examiner* — Tremesha S Willis
(74) *Attorney, Agent, or Firm* — Briggs and Morgan, P.A.

(57) ABSTRACT

A connector assembly including a connector body with a spring clip including a first free end for engaging a side wall of an electrical box upon installation. During insertion of the connector body the first free end engages the knock-out hole perimeter and deforms so as to permit further insertion. Once the connector body is fully inserted, the spring clip cooperates with a lug on the connector body to hold the connector assembly onto the electrical box. Clamp mechanisms are provided to securing the connector assembly to a cable end.

25 Claims, 32 Drawing Sheets

SNAP-IN ELECTRICAL CONNECTOR

RELATED APPLICATIONS

This application is a continuation in part of application Ser. No. 12/915,874 filed Oct. 29, 2010 for Snap-in Electrical Connector, which is incorporated herein by reference.

TECHNICAL FIELD

The invention is directed to a further advancement in the field of electrical connector assemblies. More specifically, this application relates to a snap-fit electrical connector assembly having a construction for facilitating the connection of the connector assembly and associated cable, wire conductor and the like to an electrical box.

BACKGROUND OF THE INVENTION

Electrical connectors are commonly used for attaching electrical conductors, cables, wires, electrical metal tubing (EMT) or the like to an electric box, e.g. a junction box, outlet box, switch box, fuse box, or other similar type of electric box. Such known electrical connectors are either of a type that are secured to an electric box by a threaded lock nut or by means of a circular snap fit retaining ring of the type disclosed in U.S. Pat. Nos. 6,860,758; 6,444,907; 5,189,258; 5,266,050; and 5,171,164, for example.

So called "snap fit" connectors have been in use for some time, including connectors disclosed in Applicant's U.S. Pat. Nos. 7,064,272; 7,075,007; 7,205,489 and 7,214,890. Such connectors have typically been coupled to the junction box by forcibly inserting one end of the connector into the knock-out hole of a junction box. Such connectors include a circular retaining ring which is deformed during insertion of the connector body into a knock-hole. In the past, a generally linear motion has been used to insert the connector end into the junction box. Using such a straight motion, the connector end is pushed into the knock out hole so as to deform a retaining ring as it passes through the knock-out hole.

The snap-fit connectors typically are constructed of several pieces including a barrel shaped body with separate sleeves or collars formed of spring steel. The spring steel collars typically have tangs protruding from their outer circumference. Snap-fit connectors may also have spring steel cable retainers which are fastened to the connector body via a rivet or other fastener. The rivet or other fastener are separate elements requiring additional manufacturing steps to fabricate the connector assembly.

As the snap-type connectors are constructed of several pieces, the complexity of the connector is increased. A need exists for a simple, snap-in connector having fewer component parts. A need also exists for improved manufacturing processes to decrease fabrication time of connector assemblies.

SUMMARY OF THE INVENTION

The present invention provides a connector assembly including a connector body, a spring clip and an insulator. The spring clip is multi-purpose and functions in one embodiment to both retain the connector assembly upon an electrical box and also retain an electrical cable end received within the connector body. During insertion of the connector body a free end of the spring clip engages the knock-out hole and deforms so as to permit further insertion. Once the connector body is fully seated, the free end cooperates with a locking lug to hold the connector assembly onto the electrical box. In a preferred embodiment, the spring clip functions to both retain the connector assembly upon an electrical box and also retain an electrical insulator at a front portion of the assembly. In another embodiment the spring clip additionally functions to retain an electrical cable end received within the connector body.

The present invention is also directed to a method of using a connector assembly, wherein the method includes inserting a nose end of the connector assembly into the knock-out hole with the free end of the spring clip initially deflecting from contact with a side wall of the junction box, then further inserting the connector assembly into the junction body to release the free end and lock the connector body in place. As the connector body is rotated during installation, the free end of the spring clip is initially deformed by contact with the side wall of the junction box and is then released after the spring clip end is within the junction box.

An object of the present invention is to provide an electrical connector with a multi-function spring clip whereby the connector body is secured to an outlet box through simple insertion into an outlet box.

Yet another object of the present invention is to provide an electrical connector with a spring clip having a first free end for cooperating with an edge of a knock-out hole of an outlet box to retain the electrical connector and a second free end for engaging an electrical wire. The spring clip generates a force tending to retain the connector body within the knock-out hole of the electrical box.

Yet another object of the present invention is the incorporation of a boss into the connector body which captures the spring clip during an orbital riveting process. In this manner separate fasteners are no longer required and fabrication times can be decreased.

Yet another object of the present invention is the provision of a group of related electrical connectors having a unique front-end including a multi-function spring clip and retained insulator while providing a variety of back-ends adapted to a engage a variety of cable ends, including but not limited to MC (metal clad cable) or AC (armor clad cable) cables or flexible metal conduit (FMC). The flexible nature of an internal spring or other clamp means permit the connector assembly to be utilized across a wide range of cable diameters. The clamp means may include saddle-type clamp structures having ends adapted for engagement against a cable or may include a curved cover-type clamp, such as a 90 degree cover clamp.

Yet another object of the present invention is the provision of a multi-function spring clip serving to limit pull-out of the electrical connector from an electrical box while retaining an electrical insulator against displacement. In some embodiments the multi-function spring clip also functions to secure electrical cable(s) within the connector and even define a cable divider for maintaining a separation between a pair of electrical cables.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
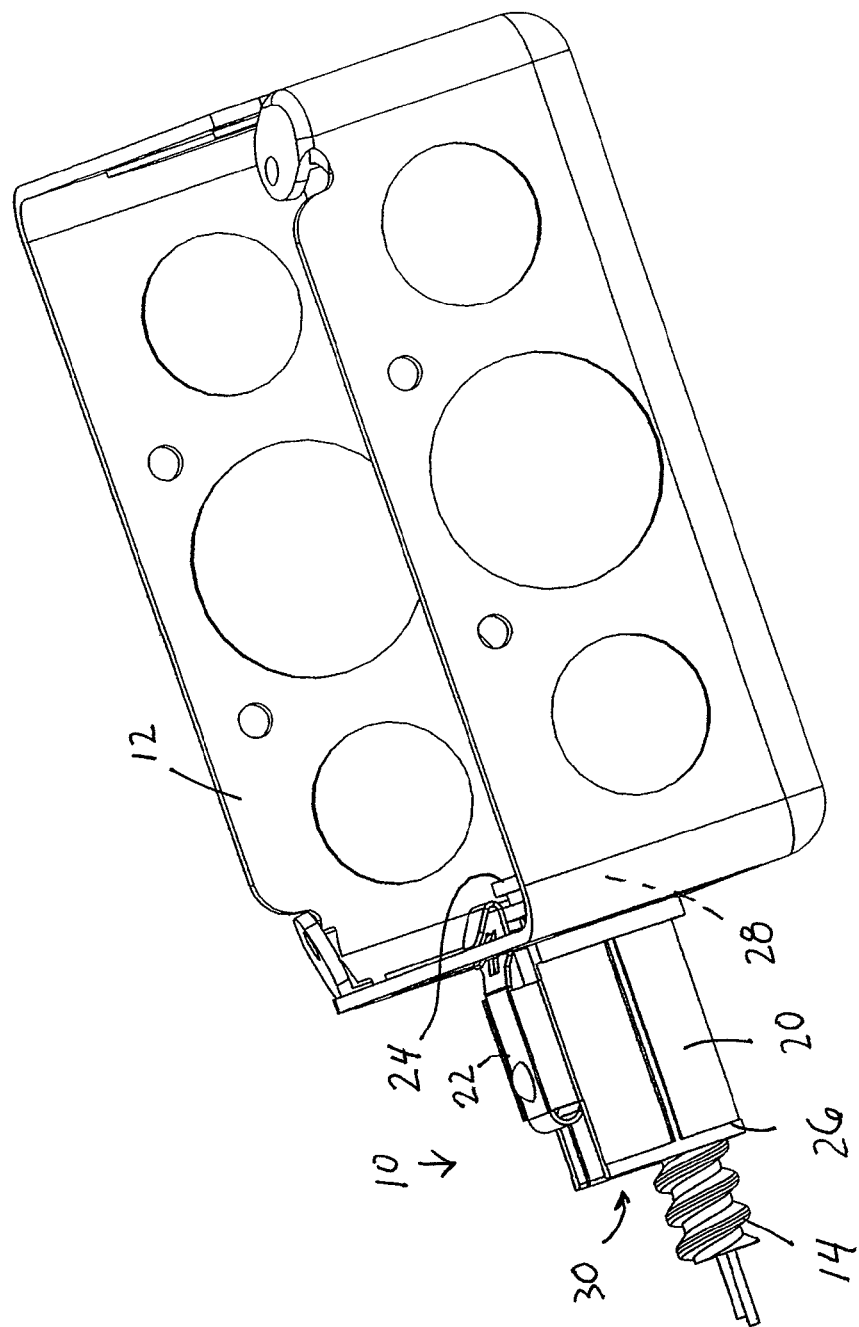
FIG. 1 is a perspective view of an electrical connector assembly in accordance with the present invention, depicted as being attached to an electrical junction box.
Figure 2:
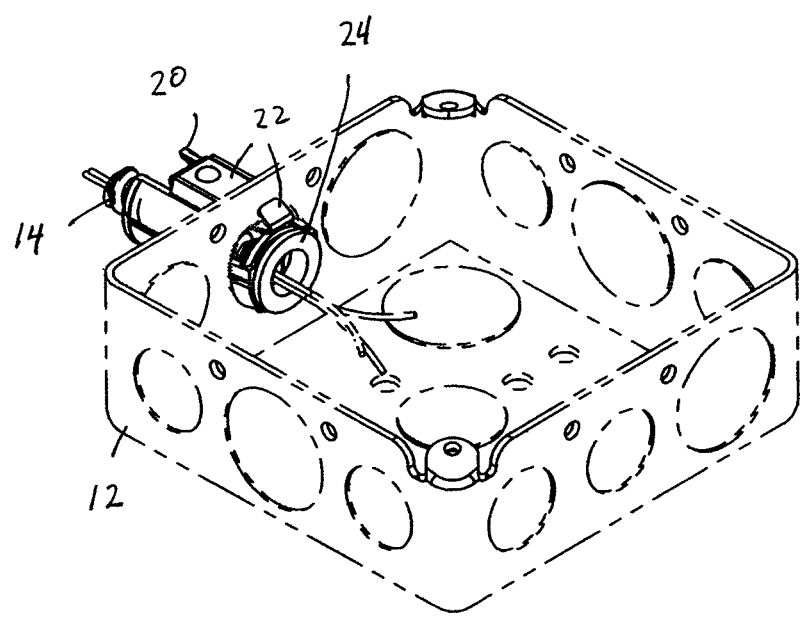
FIG. 2 is a perspective view of the electrical connector assembly of FIG. 1.

Referring to the drawings, FIGS. 1 and 2 are perspective views of the first embodiment of an electrical connector assembly 10 in accordance with the present invention. FIGS. 1 and 2 depict connector assembly 10 between junction box 12 and electrical cable 14. As described hereinafter, connector assembly 10 is used to couple electrical cable 14 at knock-out hole 16 of electrical box 12.

Connector assembly 10 includes connector body 20, spring clip 22, and insulator 24. Connector body 20 is formed with an inlet end portion 26 and an outlet end portion 28 and a bore 30 extending therethrough.

Figure 3:
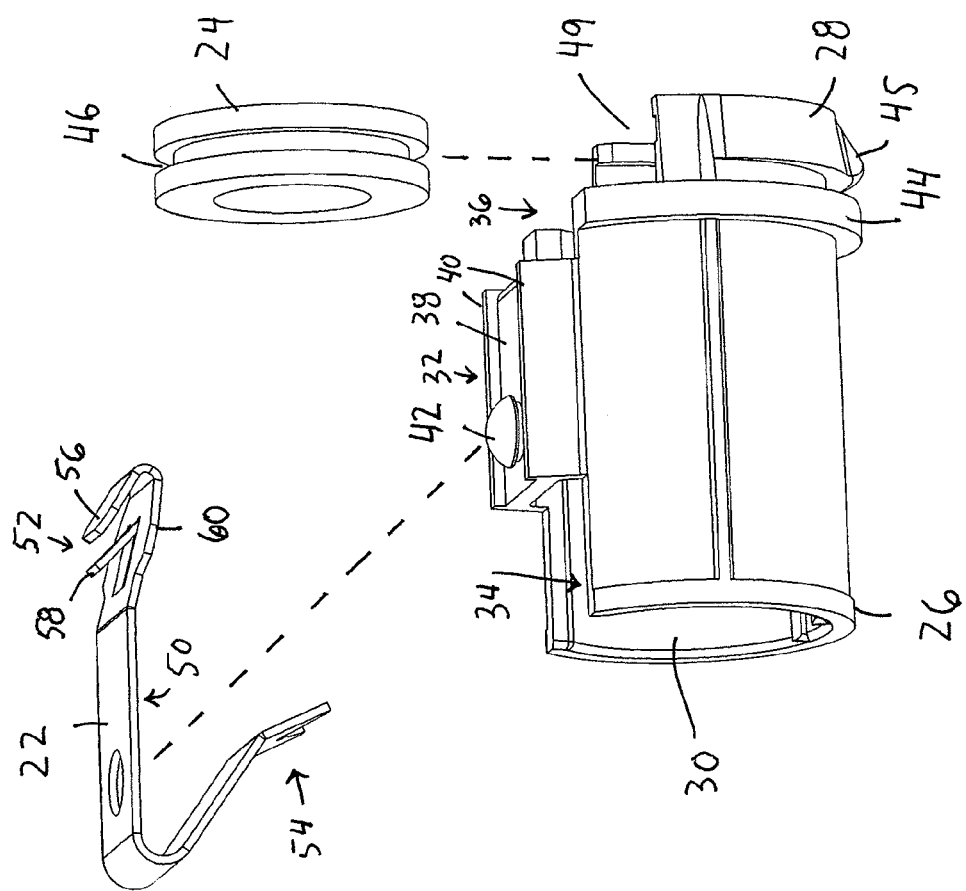
FIG. 3 is a perspective view of the electrical connector assembly of FIG. 1 in a disassembled form.

Referring to FIG. 3, connector assembly 10 is depicted in a disassembled form. Connector body 20 includes a bridge portion 32 defined between a pair of open portions 34, 36. Bridge portion 32 includes a generally planar surface 38 separating a pair of longitudinally extending walls 40. A fastener, shown as a rivet 42, secures a central portion of spring clip 22 to the planar surface 38. Walls 40 prevent spring clip 22 from rotation about rivet 42. A variety of different fasteners may be used to secure spring clip 22 to connector body 20, including but not limited to threaded fasteners, rivets, etc. The head of rivet 42 is shown in a deformed state, such as after an orbital riveting process described hereinafter.

Intermediate the connector body 20, in the illustrated embodiment between the inlet end portion 26 and outlet end portion 28, there is provided radially outwardly extending flange 44 which functions as a stop to limit the degree to which connector body 20 may be inserted through the knock-out hole 16 of electrical box 12. In the illustrated embodiment, stop flange 44 is unbroken, while in alternative embodiments stop flange 44 may comprise disjointed or separated elements, such as tabs on connector body 20 together functioning to limit the degree to which connector body 20 may be inserted into the electrical box 12.

Outlet end portion 28 includes a wedge-shaped lug 45 adapted to engage a knock-out hole 16 perimeter during insertion of the connector body 20 into the knock-out hole. As described in more detail hereinafter, lug 45 is part of a positive locking mechanism by which the connector body 20 is secured to electrical box 12.

Insulator 24 is of electrically insulative material and includes an annular groove 46 adapted to engage a corresponding tongue 48 within a receptacle 49 at the outlet end portion 28 of connector body 20. In the illustrated embodiment, insulator 24 is inserted into a generally u-shaped receptacle 49 in a direction generally perpendicular to a longitudinal axis of connector body 20. Insulator 24 is prevented from substantial movement along the longitudinal axis of connector body 20 by contact between tongue 48 and groove 46. As described hereinafter, insulator 24 is held within connector body 20 by a forward free end of spring clip 22. In another embodiment, the insulator 24 may be inserted into the connector body 20 along the longitudinal axis. For example, the insulator may be pressed into an open end of the connector body.

Spring clip 22 includes a central portion 50 and a pair of free ends 52, 54. Spring free end 52 includes a hook structure including a hook end 56 and a tab 58. A pair of tapered wing portions 60 provide additional electrical continuity between spring clip 22 and the electrical box 12. Spring free end 54 defines a cable engaging end.

The connector assembly 10 is especially useful for securing MC (metal clad) or armored cable to a panel or electrical box. MC or armored cables include a convoluted outer surface consisting of peaks and grooves such as shown in FIGS. 4A-B.

Figure 4A:
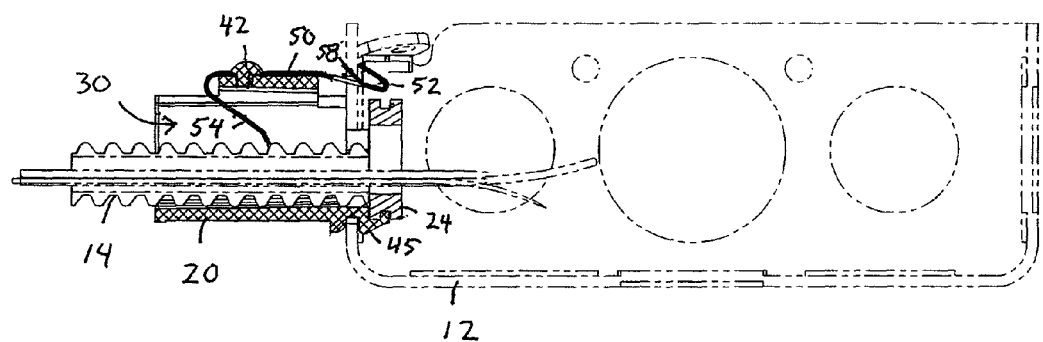
FIGS. 4A-B are cross sectional views of the electrical connector assembly of FIG. 1.

As shown in FIG. 4A, cable 14 is inserted into the bore 30 of the connector body 20 and, as a result of the flexibility imparted to the free end 54 of spring clip 22 by the length and angle of the free end, is engaged by the cable-engaging end in one of the grooves of cable 14. Again, insertion of cable 14 into the connector body 20 is limited by the insulator 24 held at the outlet end portion 28.

FIG. 4A is a cross-sectional view of connector assembly 10 shown as connected to electrical box 12. Spring free end 52 extends from central portion 50, spans across open portion 36 and across a portion of insulator 24. Hook end 56 engages an inner surface of electrical box 12 and tab 58 engages an outer surface of electrical box 12. Upon insertion of the outlet end portion 28 into electrical box 12, the hook structure of spring end 52 initially deflects and then retracts to secure the connector assembly 10 to the electrical box. Spring end 54 engages cable 14, preferably within a cable groove and provides a force tending to resist withdrawal of cable 14 from connector assembly 10. As shown in FIG. 4, insulator 24 additionally functions as a cable stop to limit further introduction of cable 14 into electrical box 12, as an outer covering of cable 14 engages portions of insulator 24 around a central bore.

Figure 4B:
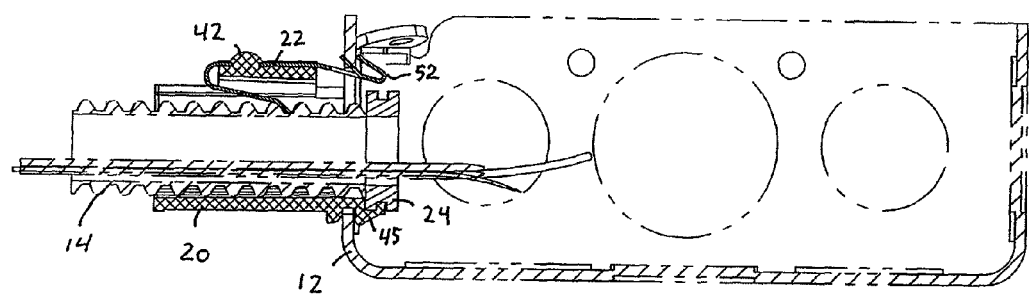
Figure 5:
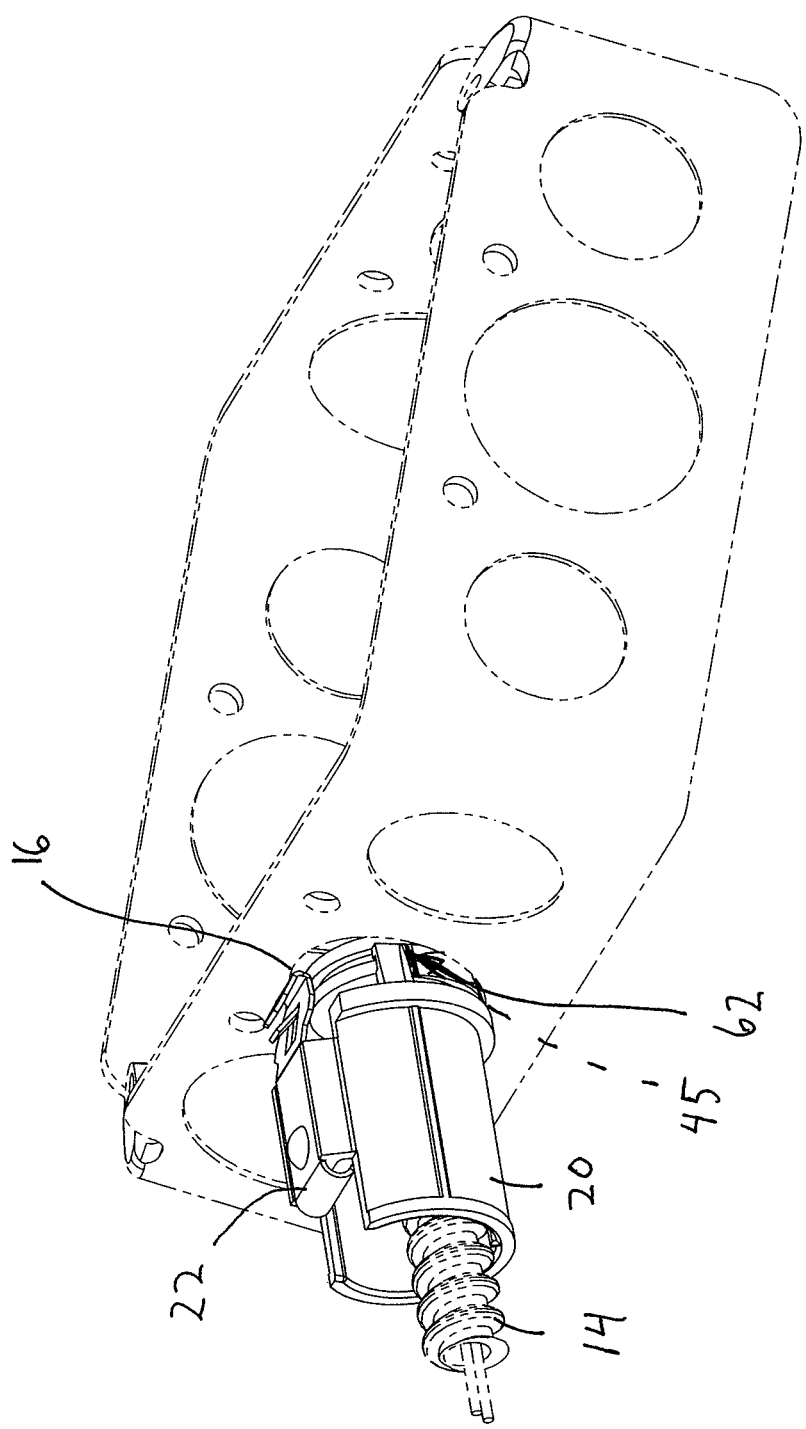
FIG. 5 is a perspective view of the electrical connector assembly of FIG. 1 as being attached to an electrical junction box.

FIG. 4B is a cross-sectional view of connector assembly 10 shown as connected to electrical box 12 and a larger cable 14, and illustrates the deflection of the spring clip 22 internally and the connector assembly's ability to accommodate a range of 0.420" to 0.600" diameter MC/AC cables. Together FIGS. 4A-B illustrate the relatively wide range of cable diameters suitable for use with the connector assembly 10 of the present invention FIG. 5 depicts insertion of connector assembly 10 into electrical box 12. Lug 45 is initially inserted to engage a lower edge portion of hole 16 and connector body 20 is then rotated generally about the lower edge portion. As spring end 52 engages an upper edge portion of hole 16, spring clip 22 deflects into the open portion 36 of connector body 20. Upon full insertion, as shown in FIG. 6, spring clip 22 retracts and engages inner and outer surfaces of the electrical box 12.

FIG. 5 also illustrates a tapered contact rib 62 on outlet end portion 28. Contact rib 62 functions to center connector body 20 within hole 16 during insertion. A portion of contact rib 62 is designed to be shaved away (by relatively sharp edges of hole 16) as the outlet end portion 28 of connector body 20 is inserted into hole 16. In additional to this alignment feature, contact rib 62 increases electrical conductivity between connector body 20 and electrical box 12.

Figure 6:
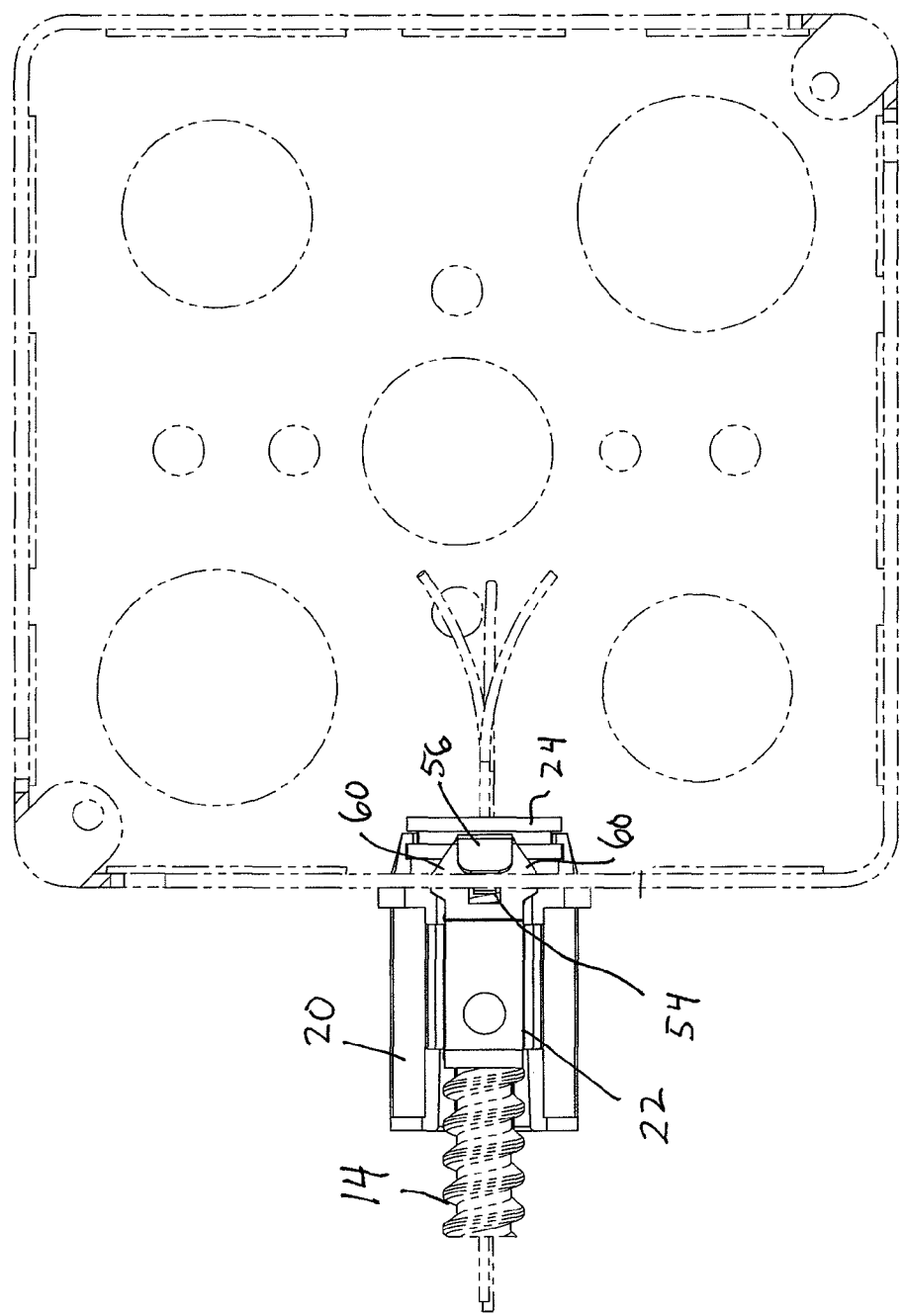
FIG. 6 is a top plan view of a blank of the electrical connector assembly of FIG. 5 upon attachment.

FIG. 6 is a top plan view of the connector assembly 10 shown as connected to electrical box 12. Electrical continuity is established by contact of spring end 52 at hook end 56, tab 58, wing portions 60, and contact of body 20, lug 45, and ribs 62.

The spring clip 22 is preferably constructed of spring steel which has a zinc or other metallic coating like tin, silver or copper, making it highly electrically conductive. In one embodiment, coating thickness is approximately 50 mils. Tests have shown that such conductive coatings on spring elements of prior art connector assemblies can reduced contact resistance over 25% as compared to uncoated spring elements. Constructing the connector body 20 of zinc alloy or other corrosion resistant alloys and the spring clip 22 of spring steel enables the connector assembly 10 to establish electrical continuity between the metallic-sheathed cable or conduit and the panel or electrical box to which it is attached.

Figure 7:
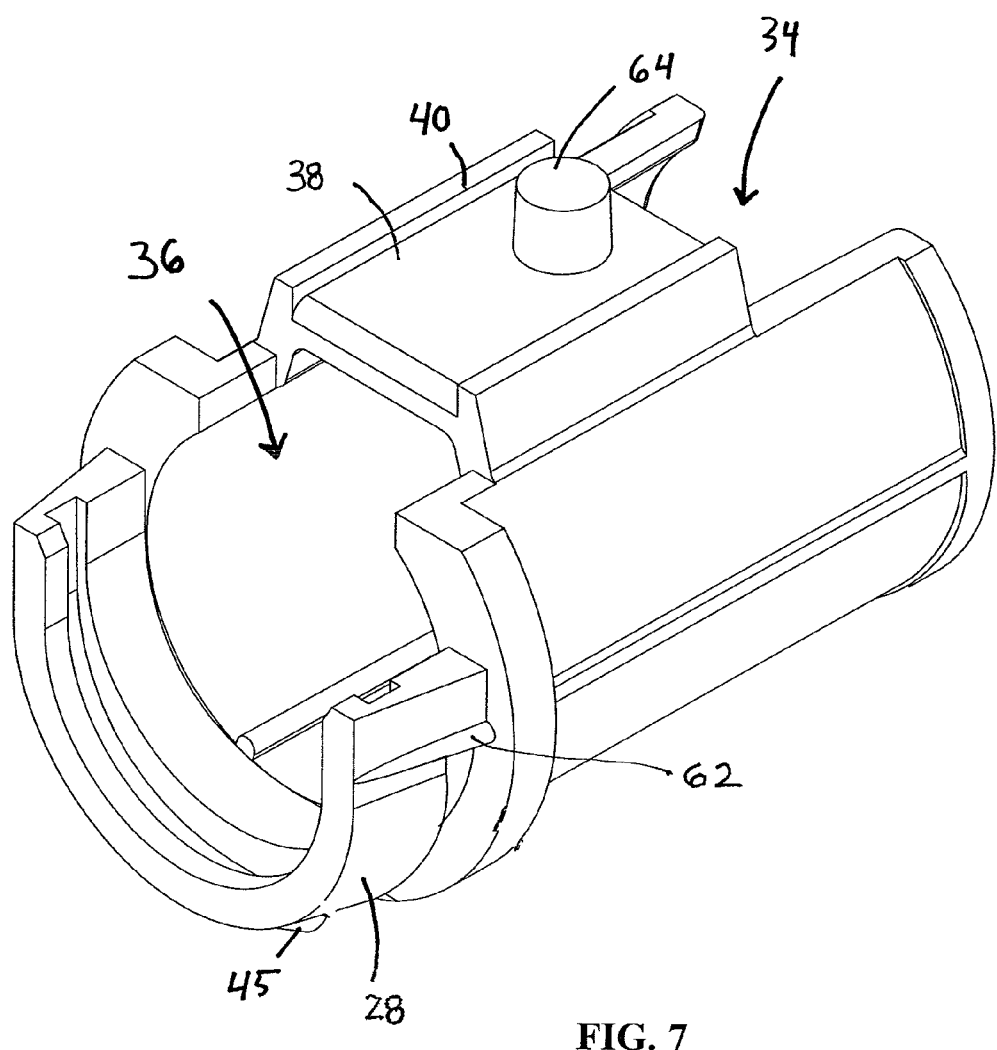
FIG. 7 is a perspective view of the connector body of FIG. 1.

FIG. 7 is a perspective view of connector body 20 showing boss 64 extending from planar surface 38 of bridge portion 32. Boss 64 is cast-in-place and thus integral to the connector body 20. Unitary boss 64 is generally cylindrical with a slight taper. Other shapes may be practicable. The diameter of boss 64 is slightly less than the diameter of the aperture in the spring clip 22. Boss 64 is deformed via an orbital riveting process to securely fasten spring clip 22 to connector body 20.

Figure 8:
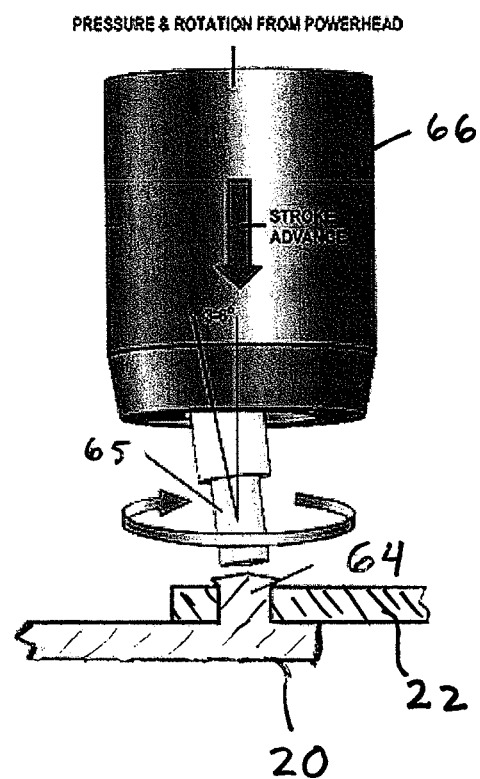
FIG. 8 depicts a manufacturing process by which the connector body is secured to the spring clip element via an orbital riveting process.

FIG. 8 depicts an orbital riveting process by which spring clip 22 is secured to connector body 20. Orbital riveting is a cold-forming process used to join materials together. The orbital riveting process uses an orbital head 65 and forming tool 66 mounted, for example, at a 3 or 6° angle. The forming tool 66 engages boss 64 and then presses it while rotating to gradually form the material of boss 64 into a head that holds the assembly together. Importantly, without the need for a separate rivet or fastener, the time of the fabrication is dramatically decreased. Unlike conventional riveting, it is straightforward to quickly join materials. Unlike the use of separate threaded fasteners, there is no required drilling and/or tapping of the connector body. Unlike traditional stamped rivets or fasteners, there is no requirement for external support to resist relatively high deforming forces.

Figure 9:
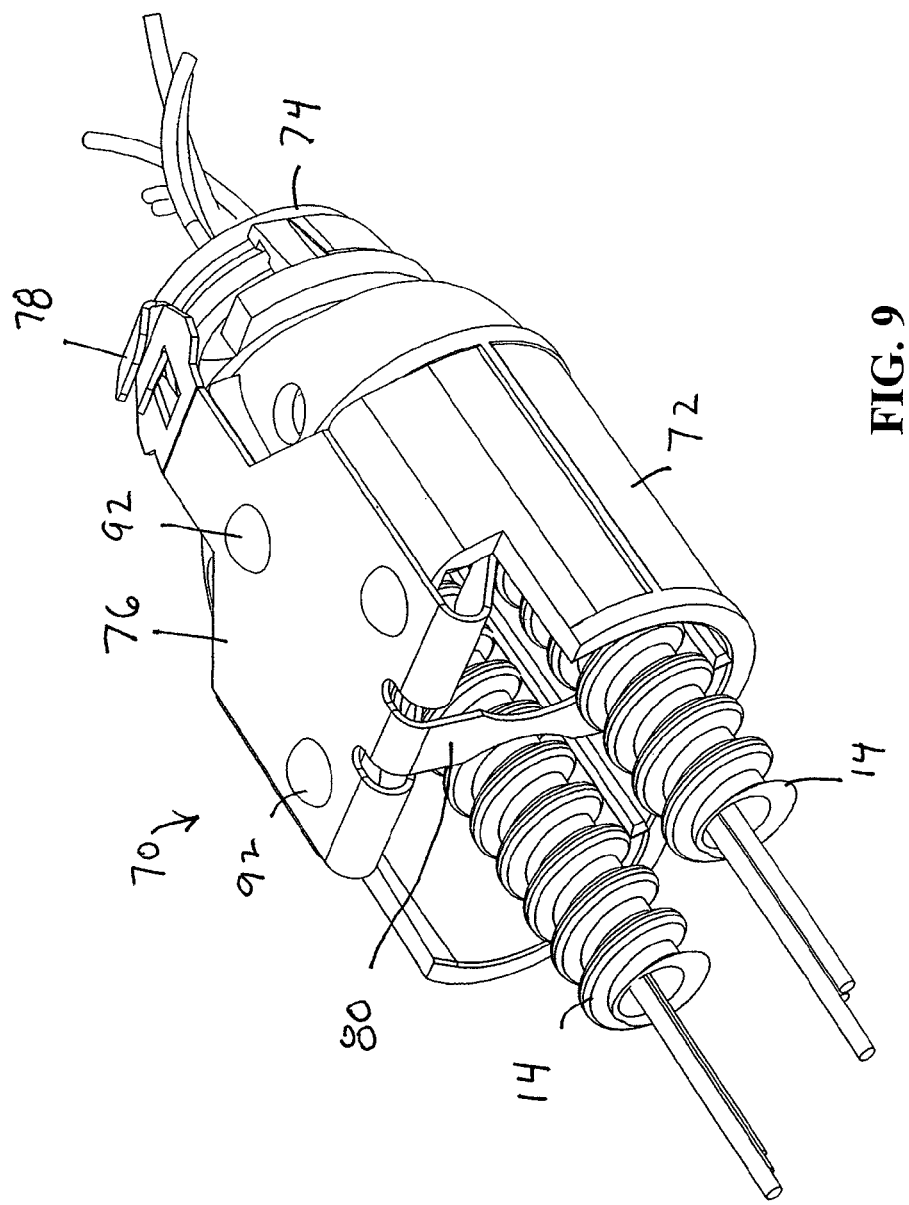
FIG. 9 is a perspective view of a second embodiment of an electrical connector of the present invention.

FIG. 9 is a duplex version of connector assembly 70 for securing a pair of electrical cables 14 to an electrical box 12. Connector assembly 70 includes connector body 72, insulator 74, and duplex spring clip 76. Similar to the spring clip 22 of FIGS. 1 through 6, modified duplex spring clip 76 engages an electrical box 12 at one end 78 and engages a pair of cables 14 at its other ends. A cable divider 80 is defined by a portion of spring clip 76 and functions to maintain separation between the pair of cables 14.

Figure 10:
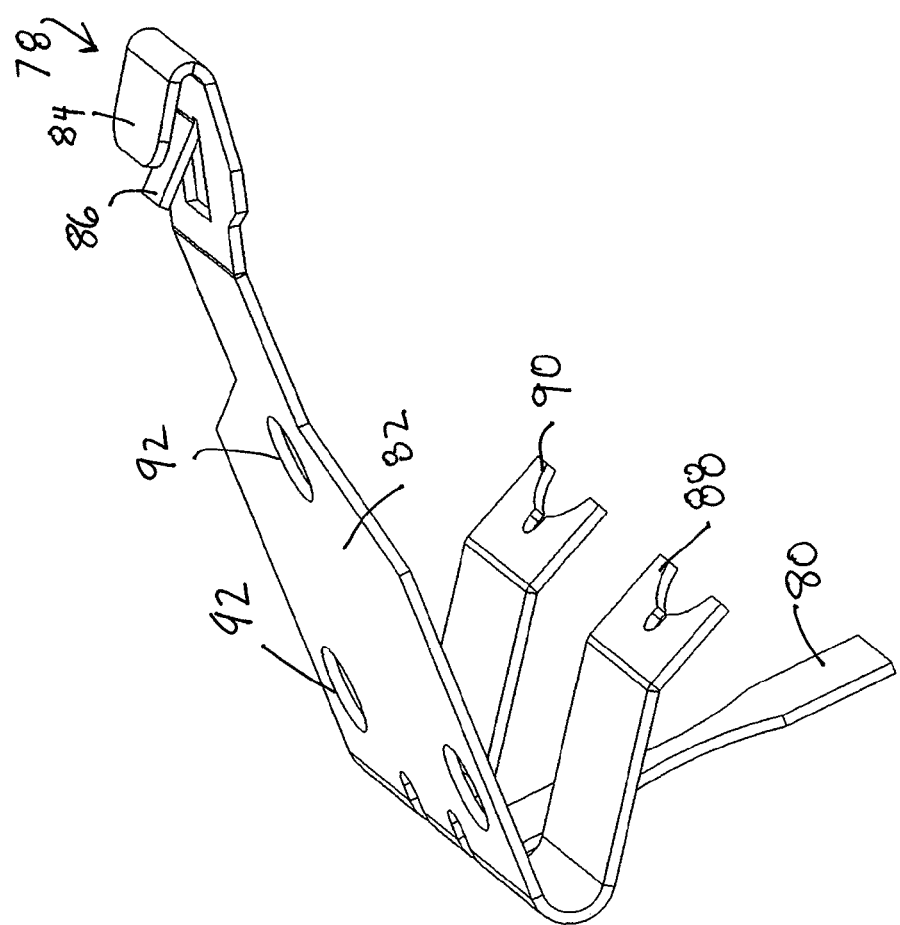
FIG. 10 is a perspective view of the spring clip of the connector of FIG. 9.

Spring clip 76 is illustrated in FIG. 10 and includes a central portion 82 separating the free spring ends. Spring clip 76 includes first spring end 78 having a hook structure including a hook end 84 and a tab 86. Cable engaging ends 88, 90 are adapted to engage cables 14. A plurality of apertures 92 are formed in the central portion of spring clip 76 through which a plurality of fasteners 42 pass to secure spring clip 76 to connector body 72.

Figure 11:
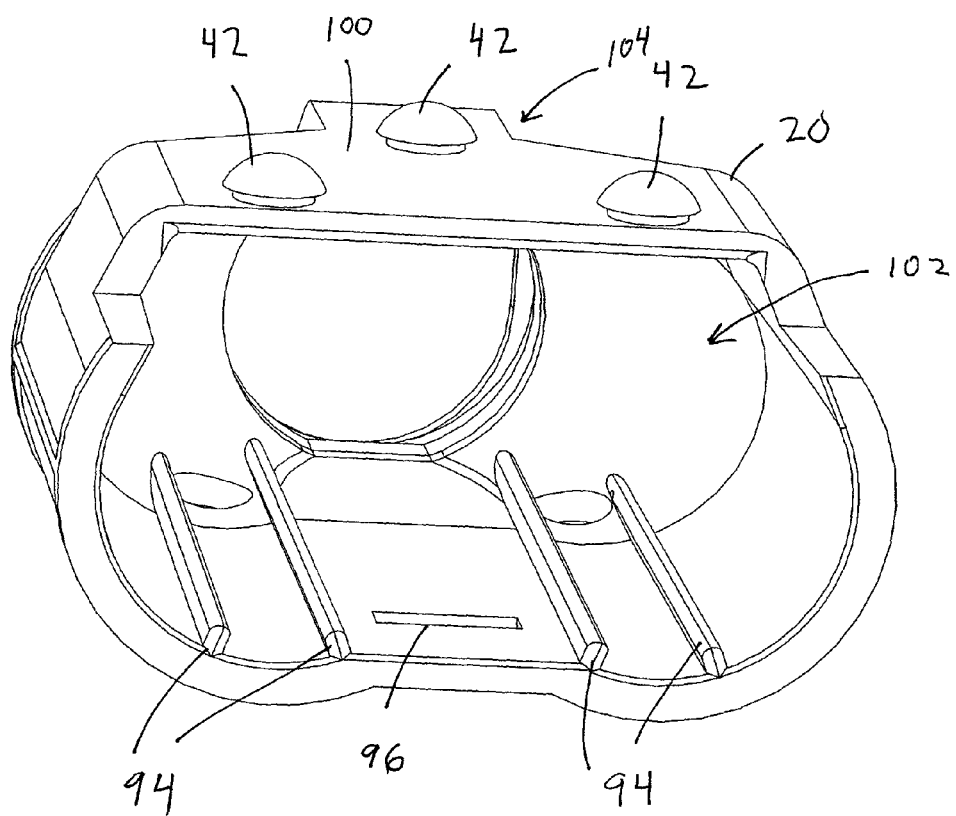
FIG. 11 is a perspective view of the connector body of the connector of FIG. 9.

As shown in FIG. 11, connector body 72 includes alignment ribs 94 which tend to center the electrical cables 14 within the connector body 72. As the electrical cables 14 are inserted into the connector body 72, ribs 94 engage the cables and tend to align and center the cables 14 within the connector body 72. Ribs 94 provide further electrical continuity between connector 70 and electrical cables 14. The connector assembly 10 of FIGS. 1 though 6 also includes alignment ribs.

Connector body 72 further includes a cavity 96 for engagement with an end of cable divider 80. Connector body 72 includes a bridge portion 100 defined between a pair of open portions 102, 104. Bridge portion 100 includes a generally planar mount surface. Fasteners, shown as a rivets 42, secure a central portion of spring clip 76 to the planar mount surface. A variety of different fasteners may be used to secure spring clip 76 to connector body 70, including but not limited to threaded fasteners, rivets, etc.

Figure 12:
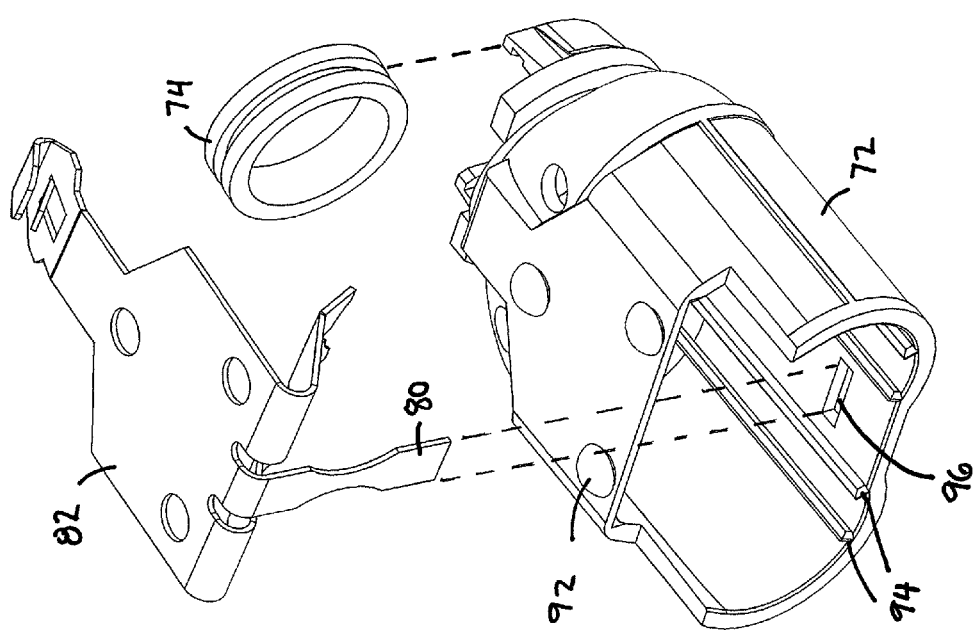
FIG. 12 is a perspective view of the electrical connector assembly of FIG. 9 in a disassembled form.

FIG. 12 depicts the connector assembly of FIG. 9 in an exploded, disassembled view. As shown, the free end of cable divider 80 is received into cavity 96.

Figure 13:
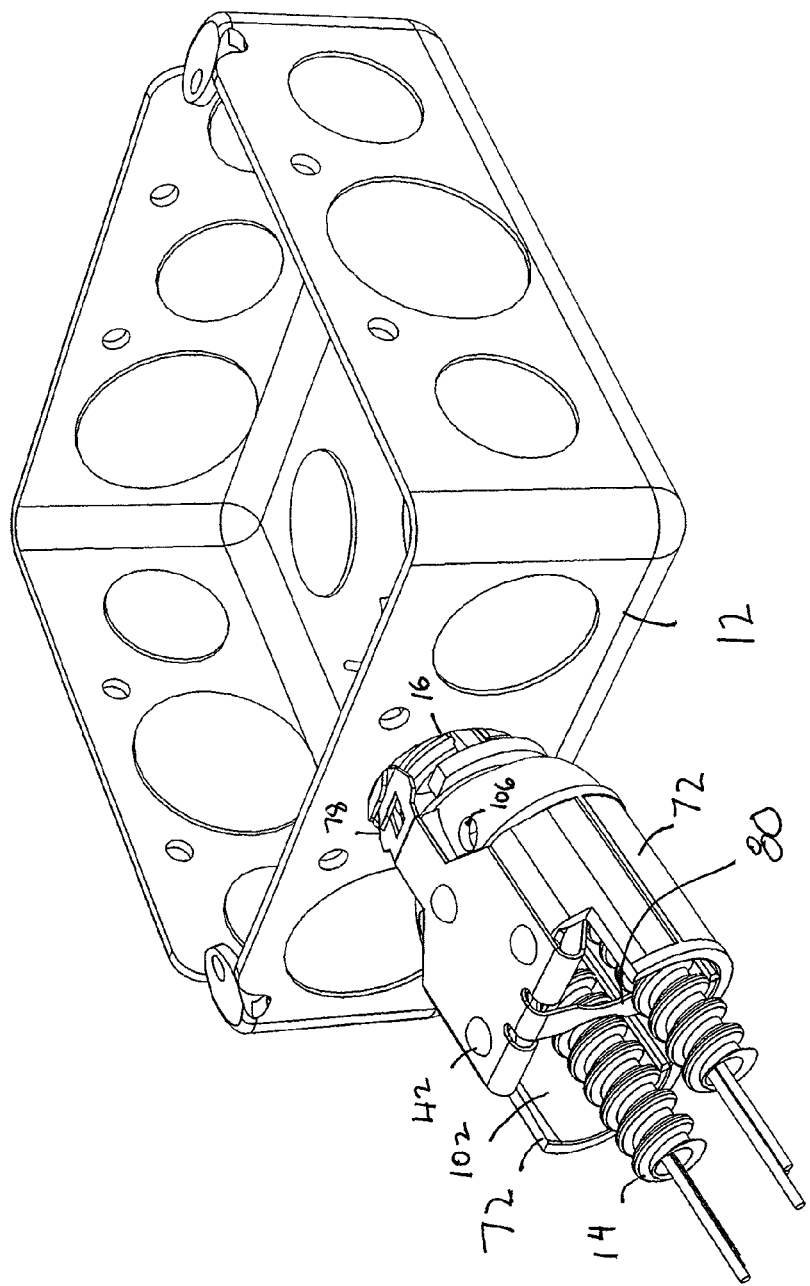
FIG. 13 is a perspective view of the connector of FIG. 9 as being attached to an electrical box.

FIG. 13 depicts insertion of connector assembly 70 into electrical box 12. Spring end 78 is shown engaging an upper edge of hole 16. As spring end 78 is further inserted, spring end 78 initially deflects toward insulator 74 prior to engaging inner and outer surfaces of electrical box as shown in FIG. 13.

Figure 15:
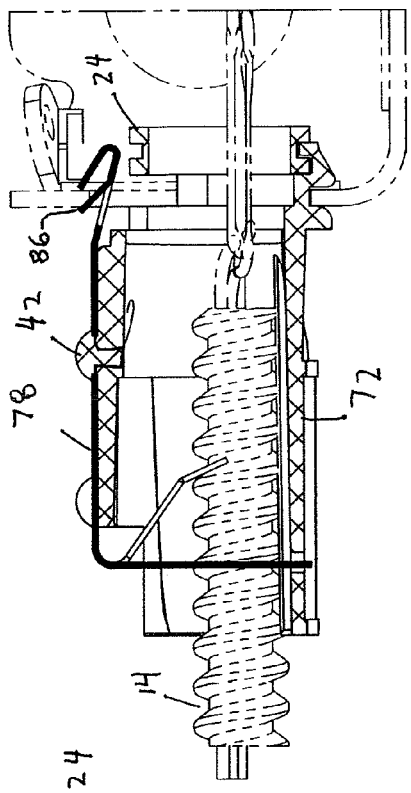
FIG. 15 is a cross-sectional view of the connector and electrical box of FIG. 13.
Figure 14:
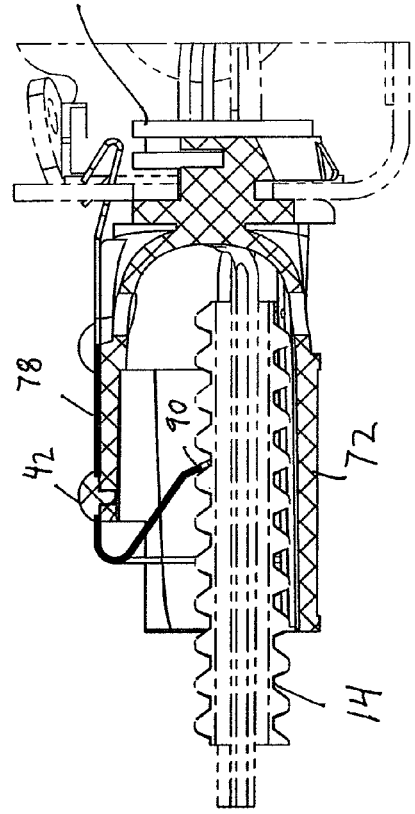
FIG. 14 is a cross-sectional view of the connector and electrical box of FIG. 13.

FIGS. 14 and 15 are cross-sectional views of the connector assembly 70 as secured to electrical box 12. FIG. 14 illustrates a cross-sectional view taken through spring end 86. FIG. 15 illustrates a cross-sectional view taken through cable divider 80. As shown in FIG. 15, the free end of cable divider 80 is retained within cavity 96, which in this embodiment is an aperture in connector body 72. Ends of cable 14 engage an inner surface of connector body 72 to limit further introduction of cables into the assembly. In this embodiment, insulator 24 does not necessarily function as a cable stop.

Figure 16:
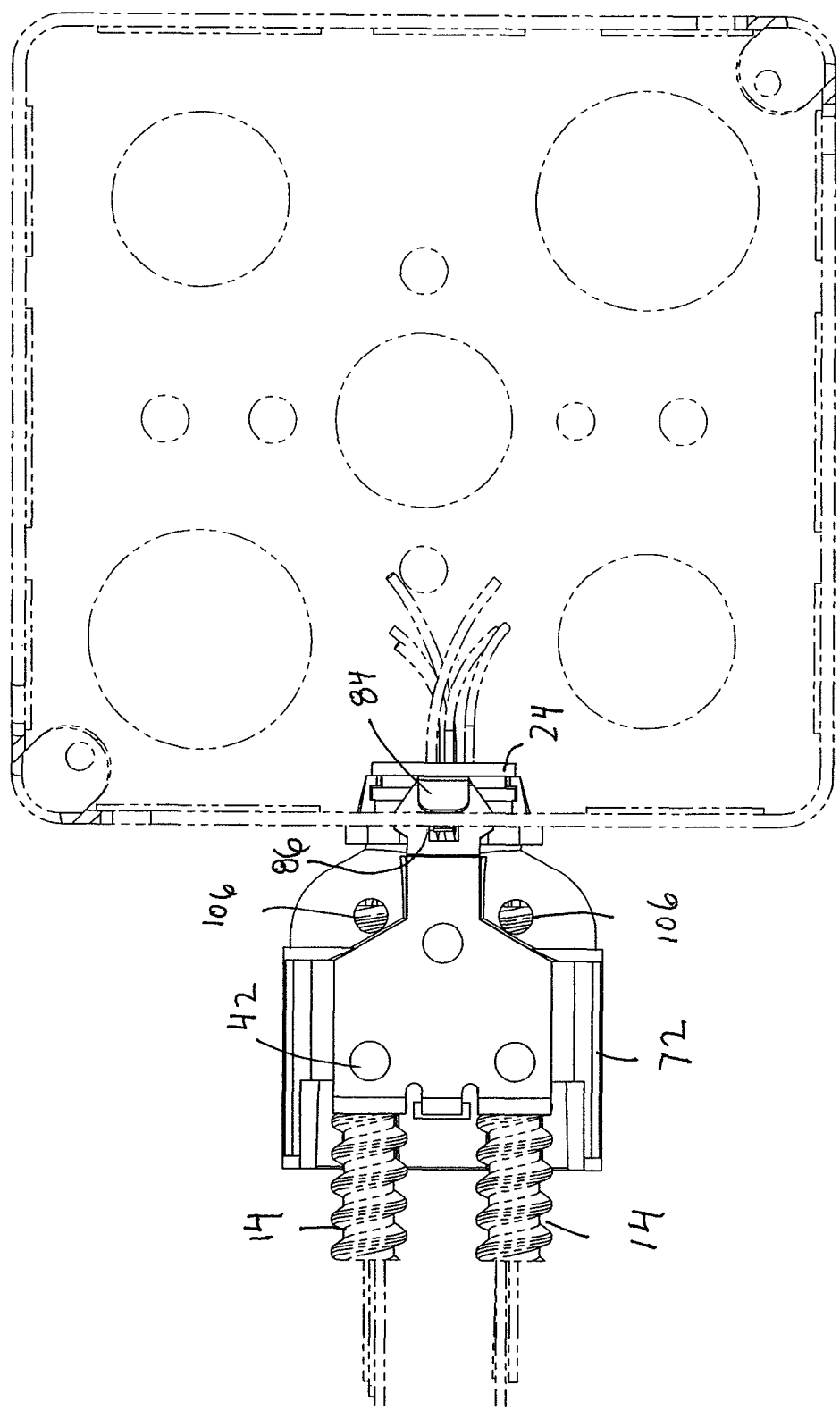
FIG. 16 is a top plan view of the connector and electrical box of FIG. 13 upon attachment.

FIG. 16 is a top plan view of the connector assembly 70 shown as attached to electrical box 12. Witness holes 106 are provided through which visual inspection of the cable 14 end may be made.

Embodiments of connector assemblies of the present invention are designed to secure MC (metal clad cable) or AC (armor clad cable) cables or ⅜" flexible metal conduit (FMC) to an electrical box or enclosure. The connectors may accept multiple versions of these cables, for example 14/2 or 10/3, which may vary in outer diameter from 0.420" to 0.600". The flexible nature of the spring clip and internal guide ribs permit the connector assembly to be utilized across a range of cable diameters. In other embodiments of the present invention, other cable types and size may be utilized.

Figure 17:
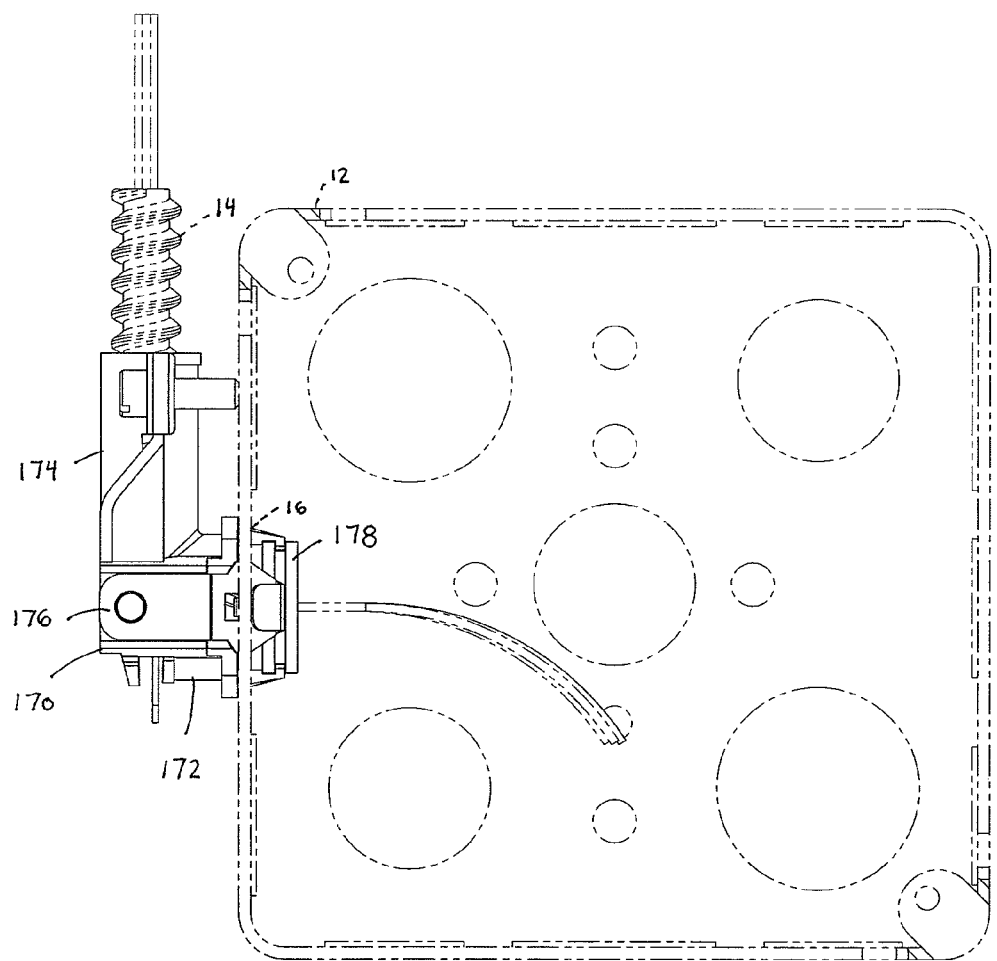
FIG. 17 is a top plan view of a second embodiment of an electrical connector assembly of the present invention as attached to an electrical box.

Yet another embodiment of the present invention is illustrated in FIGS. 17 through 27. Referring to FIG. 17, connector assembly 170 includes connector body 172, cover member 174, spring clip 176, and insulator 178. Connector assembly 170 is shown as connected to electrical box 12 and an end of electrical cable 14.

Figure 18:
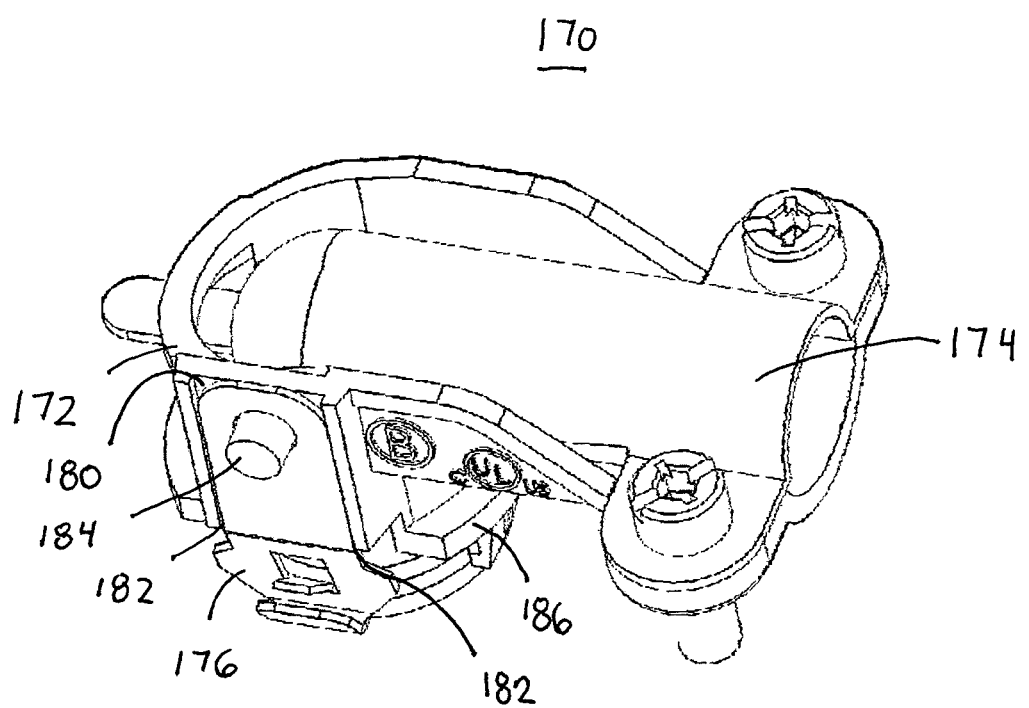
FIG. 18 is a perspective view of the connector assembly of FIG. 17.

Referring to FIG. 18, connector body 172 includes a bridge portion 180 having a generally planar surface separating a pair of longitudinally extending walls 182. A fastener 184 secures spring clip 176 to connector body 172 generally against the planar surface of bridge portion 180. Walls 182 prevent spring clip 176 from rotation about fastener 184. A radially outwardly extending flange 186 which functions as a stop to limit the degree to which connector body 172 may be inserted through the knock-out hole of electrical box 12.

Figure 19:
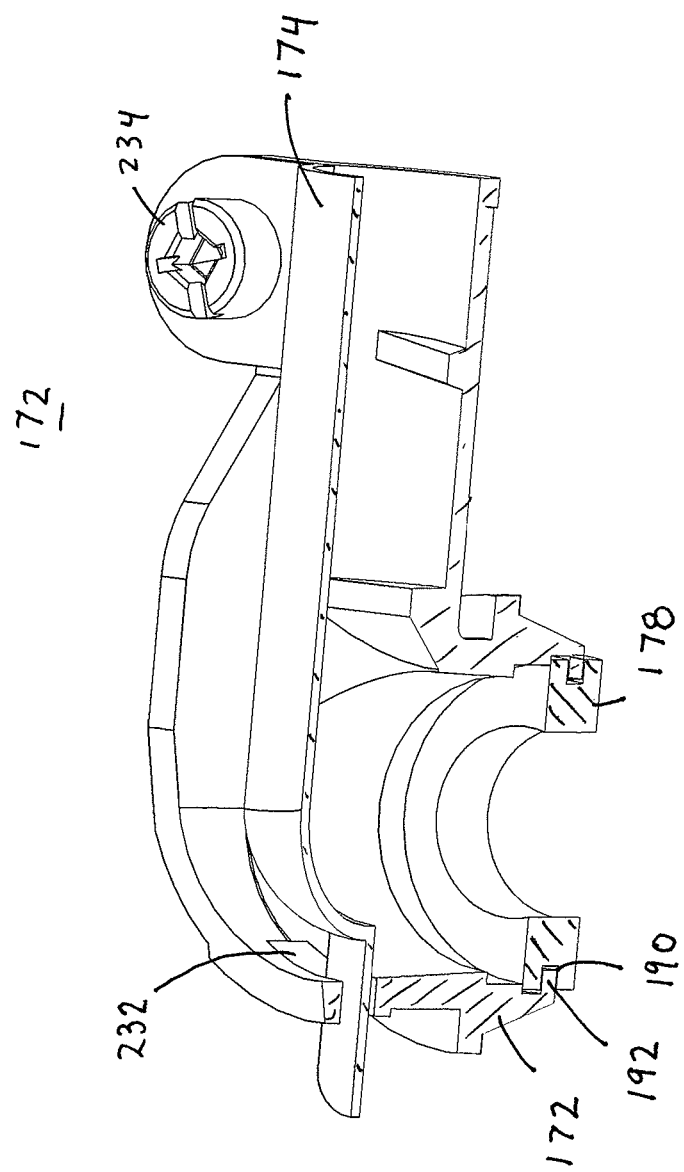
FIGS. 19 and 20 are cross-sectional views of the connector assembly of FIG. 18.
Figure 20:
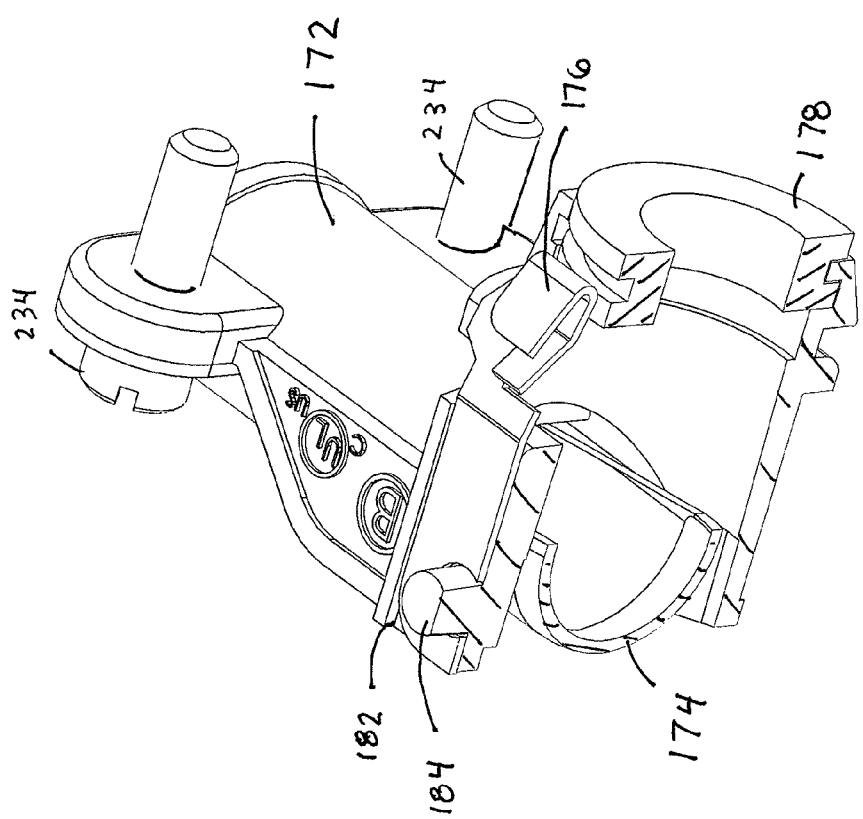

FIGS. 19 and 20 are cross-sectional views of the connector assembly 170. Insulator 178 is of electrically insulative material and includes an annular groove 190 adapted to engage a corresponding tongue 192 within connector body 172. In the illustrated embodiment, insulator 178 is inserted into a generally u-shaped receptacle and is prevented from substantial movement by contact between tongue 192 and groove 190. Insulator 178 is held within connector body 172 by a free end of spring clip 176.

Figure 21:
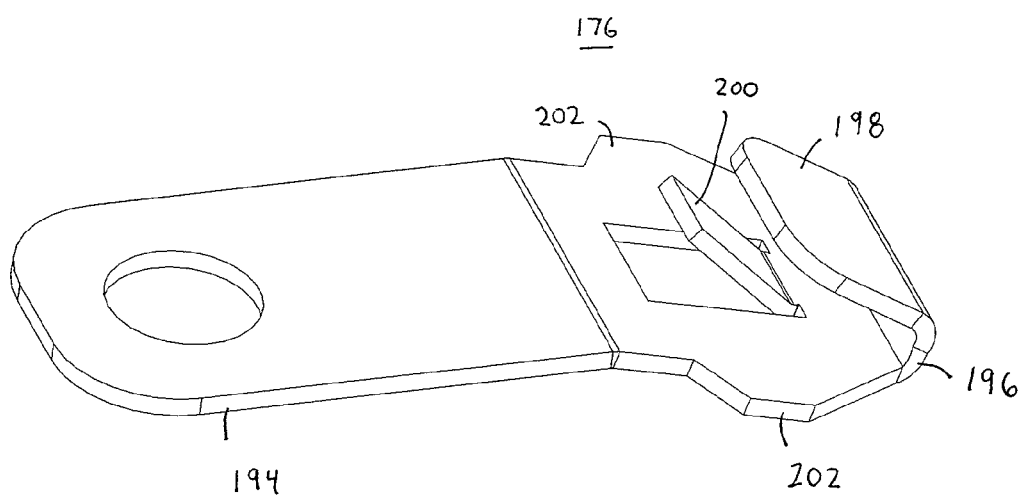
FIG. 21 is a perspective view of the spring clip of the connector assembly of FIG. 17.

Spring clip 176 is shown in FIG. 21 and includes a mounting portion 194 and a free end 196. Mounting portion 194 may be characterized as a second end of spring clip 176 opposite free end 196. During assembly, a portion of fastener 184 is received through an aperture in the mounting portion 194. Free end 196 includes a hook structure including a hook end 198 and a tab 200. A pair of tapered wing portions 202 provide additional electrical continuity between spring clip 176 and the electrical box 12. Free end 196 of spring clip 176 is positioned to retain insulator 178 within the connector body 172.

Figure 22:
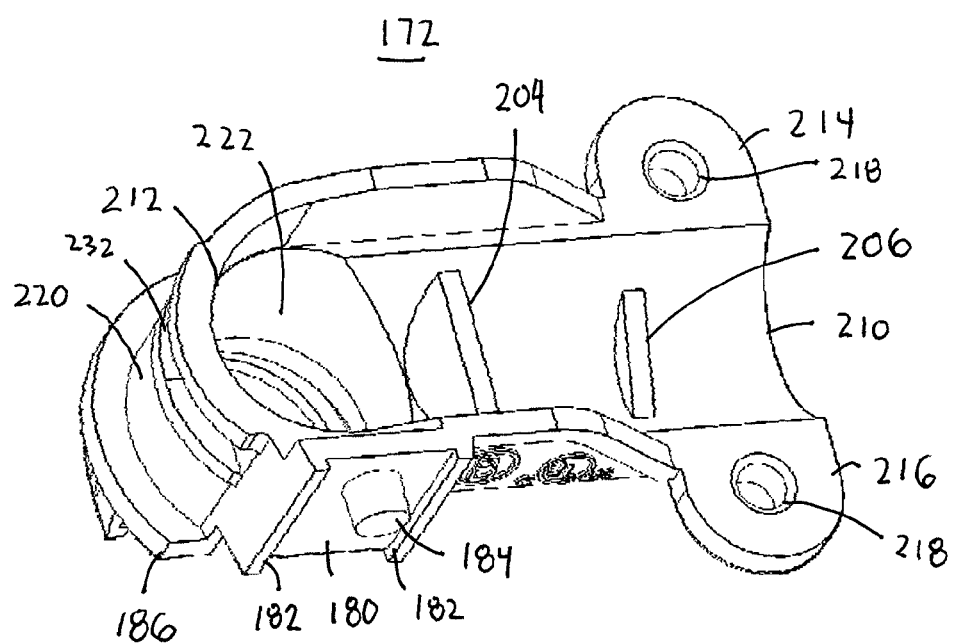
FIGS. 22 and 23 are perspective views of the connector body of the connector assembly of FIG. 17.
Figure 23:
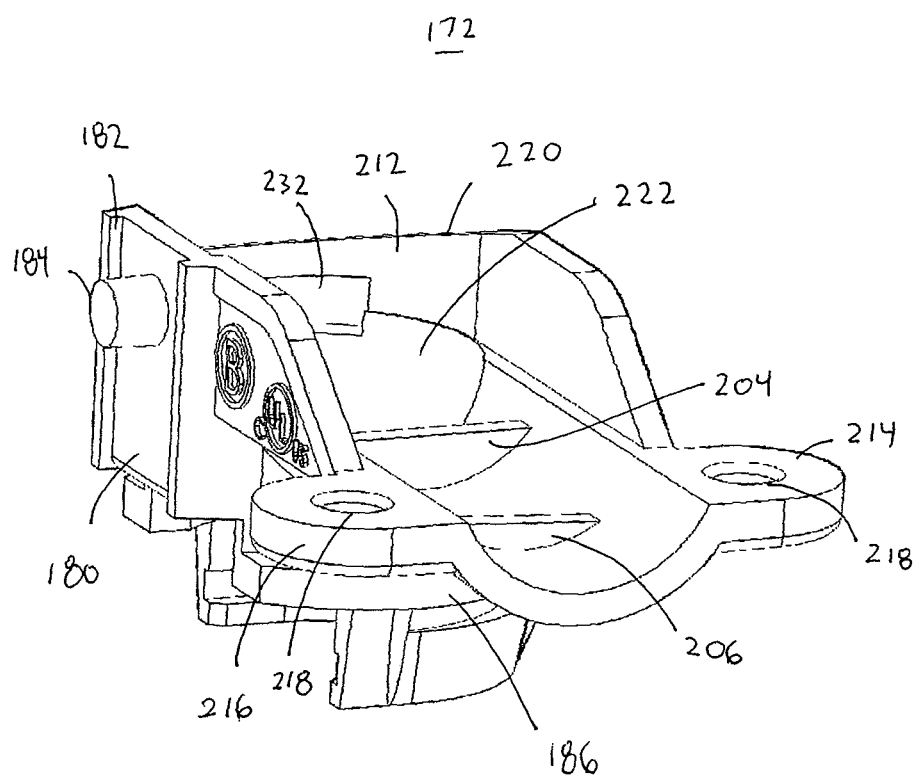

FIGS. 22 and 23 illustrates connector body 172 wherein the head of fastener 184 is shown in an undeformed state, such as before an orbital riveting process described above. Fastener 184 is formed as a boss extending from the planar surface of bridge portion 180. The boss is cast-in-place and thus integral to the connector body 172 and is adapted to be deformed via an orbital riveting process to securely fasten spring clip 176 to connector body 172. A variety of other fasteners, such as threaded fasteners, rivets, etc., could be utilized to secure spring clip 176 to connector body 172 in alternative embodiments of the invention.

Connector body 172 incorporates an upstanding wall 204 employed as an abutment stop for enabling the terminating end of flexible metal conduit and/or armored or metal clad cable to be easily positioned on connector body 172 in the desired location. Furthermore, connector body 174 also incorporates slanted flange 206, formed thereon between terminating end 210 and upstanding wall 212. Preferably, slanted flange 206 is positioned and constructed for cooperative engagement with the convolutions typically formed in the flexible metal conduit and/or armored or metal clad cable. In this way, flexible metal conduit and/or armored or metal clad cable is quickly and easily positioned in direct captured association with connector body 172, while also being securely retained in the precisely desired location. Connector body 172 incorporates flanges 214 and 216 extending in opposite directions from the side edges thereof, directly adjacent terminating end 210. Furthermore, flanges 214 and 216 incorporate threaded, screw receiving apertures 218 formed therein.

In the preferred construction, connector body 172 incorporates substantially cylindrically shaped front section 220. A curved forward portion of the cover member 174 is located proximate to the cylindrically shaped front section 220. The curved forward portion of cover member 174 may be in contact with the cylindrically shaped front section 220 or may be displaced slightly away therefrom. Furthermore, in the preferred embodiment, cylindrically shaped front section 220 incorporates the radially extending flange 186. Cylindrically shaped front section 220 peripherally surrounds and defines a central passageway 222 which is constructed for enabling the wires extending through any desired flexible metal conduit and/or armored or metal clad cable mounted to connector assembly 170 to extend into the outlet box or junction box to which connector assembly 170 is secured.

Figure 24:
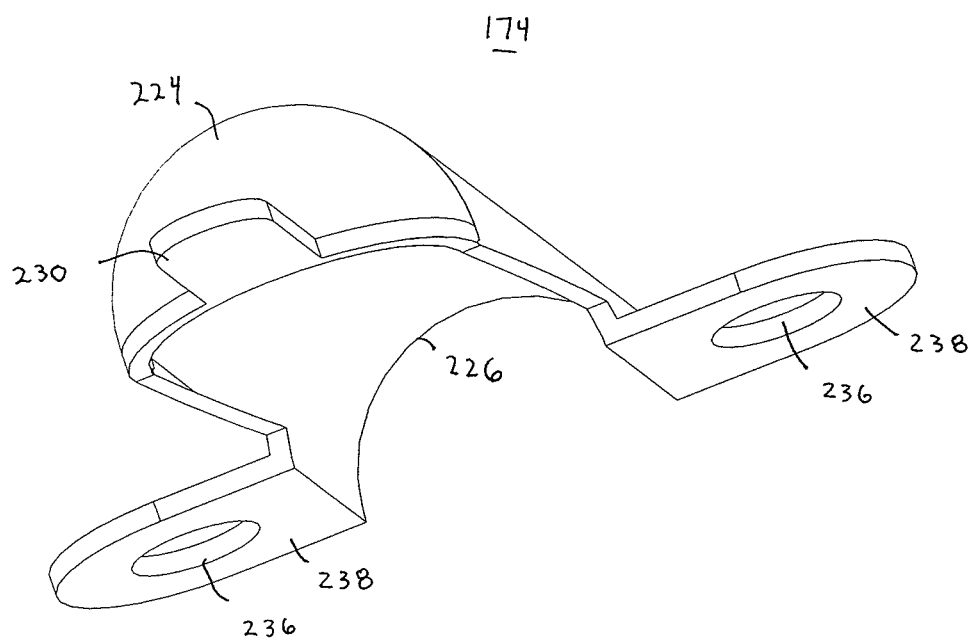
FIGS. 24 and 25 are perspective views of the cover of the connector assembly of FIG. 17.
Figure 25:
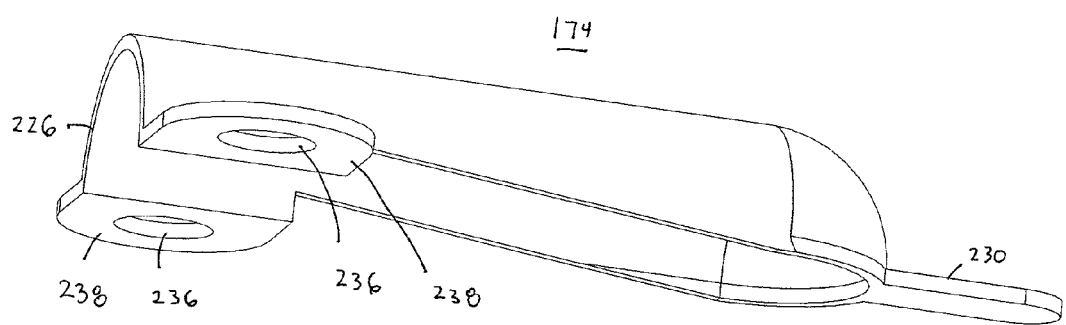

FIGS. 24-25 illustrate cover member 174. Cover member 174 comprises a curved shape extending from a proximal end 224 to its terminating end 226. The curved shape of cover member 174 is constructed for enabling a variety of desired flexible metal conduit and/or armored or metal clad cable to be positioned therein in secure, nested engagement.

Cover member 174 comprises curved proximal end 224 constructed with extension tab 230 for cooperating, mating engagement with an upstanding wall portion of body 172. Extension tab 230 is formed at the proximal end 224, which is employed, as more fully detailed below, for locking engagement in elongated slot 232 of body 172. Elongated slot 232 is constructed for cooperatively engaging extension tab 230 which is formed on cover member 174, for enabling cover 174 and body 172 to cooperate with each other for ease of assembly. By employing these components, cover member 174 is capable of engagement with body 172, enabling flexible metal conduit and/or armored or metal clad cable to be easily inserted and lockingly engaged therewith, with ease and simplicity.

In completing the construction of connector assembly 170, screw members 234 are mounted through enlarged apertures 236 of flanges 238 of cover member 174, with the threaded shanks of screw members 234 being threadedly engaged in threaded apertures 218 of flanges 214 and 216 of body 172. Finally, screw members 234 are advanced in threaded engagement in threaded apertures 218 to secure the cover member 172 to connector body 172.

With flexible metal conduit and/or armored or metal clad cable positioned in a desired location on connector body 172, extension tab 230 is inserted into elongated slot 232 and cover member 174 is placed in overlying, contacting engagement with flexible metal conduit and/or armored or metal clad cable, effectively sandwiching and clamping flexible metal conduit and/or armored or metal clad cable between cover member 174 and body 172. In this way, flexible metal conduit and/or armored or metal clad cable is securely mounted in the precisely desired location with ease and simplicity by a single operator. A variety of desired flexible metal conduit and/or armored or metal clad cable is quickly and easily securely mounted to connector assembly 170 by a single individual, with the flexible metal conduit and/or armored or metal clad cable securely clamped between cover member 174 and body 172.

Figure 26:
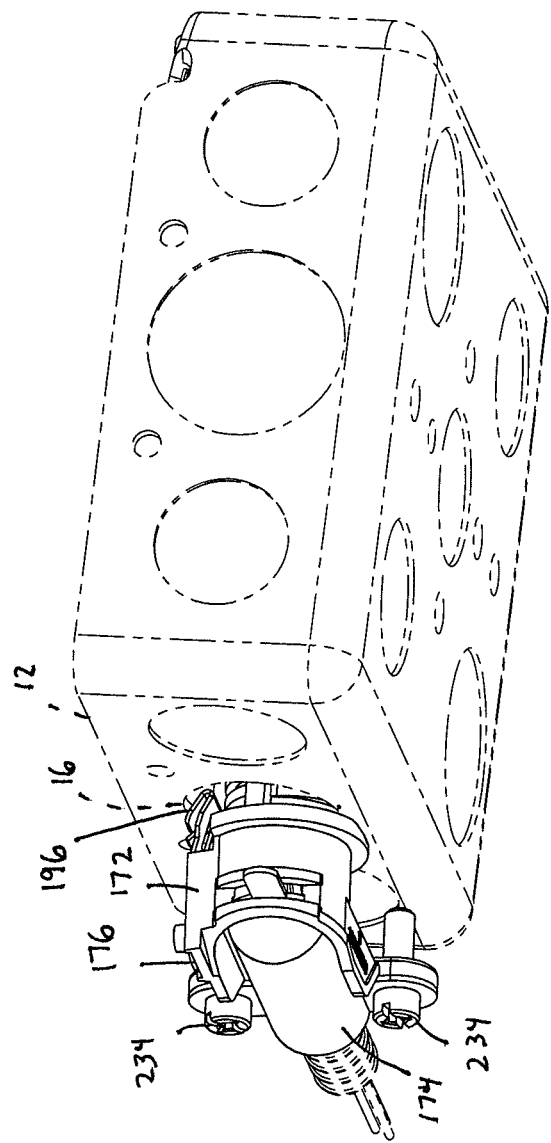
FIG. 26 depicts a method of attaching the connector assembly of FIG. 17 to an electrical box.

FIG. 26 depicts insertion of connector assembly 170 into electrical box 12. A lower lug (similar to lug 45) is initially inserted to engage a lower edge portion of hole 16 and connector body 172 is then rotated generally about the lower edge portion. As the free end 196 of spring clip 176 engages an upper edge portion of hole 16, spring clip 176 deflects toward insulator 178. Upon full insertion spring clip 176 retracts and engages inner and outer surfaces of the electrical box 12.

Figure 27:
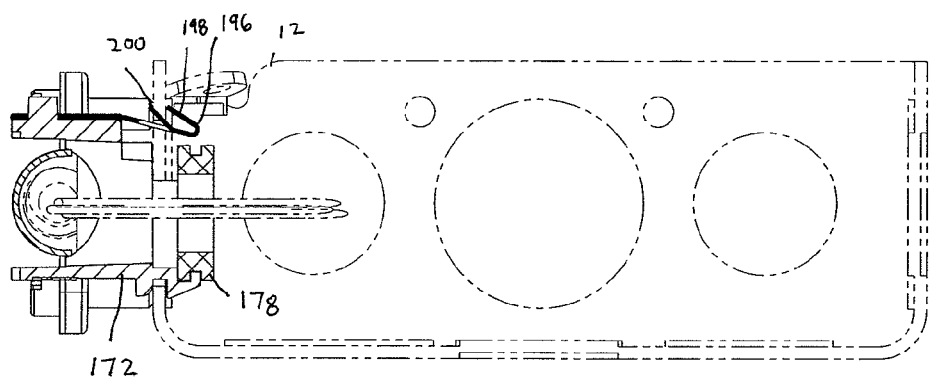
FIG. 27 is a cross-sectional view of the connector assembly and electrical box of FIG. 17.

FIG. 27 is a cross-sectional view of connector assembly 170 subsequent to insertion into electrical box 12. Similar to the embodiment of FIGS. 1 through 16, a portion of the wall of the electrical box 12 is held between hook end 198 and tab 200 of spring clip 176. Tab 200 of spring clip 176 thus substantially limits pull-out of the electrical connector 170 from the electrical box 12, while free end 196 of spring clip 176 prevents displacement of the electrical insulator 178.

Figure 28:
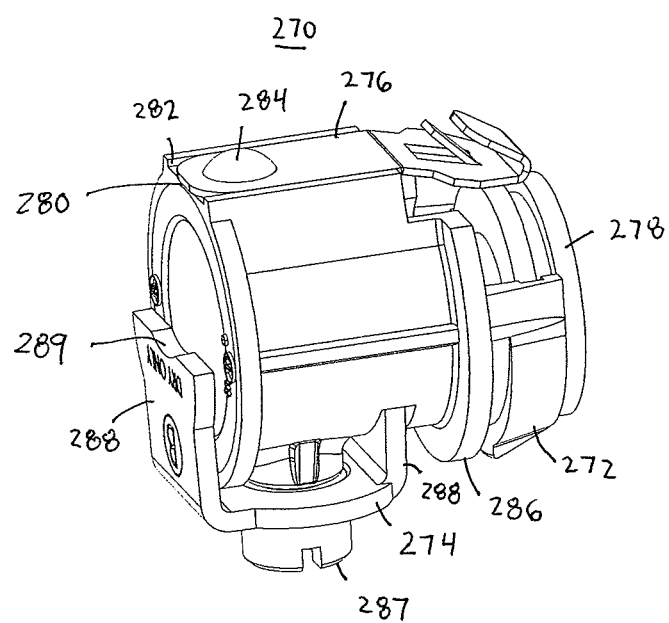
FIG. 28 is a perspective view of a third embodiment of an electrical connector assembly of the present invention.
Figure 29:
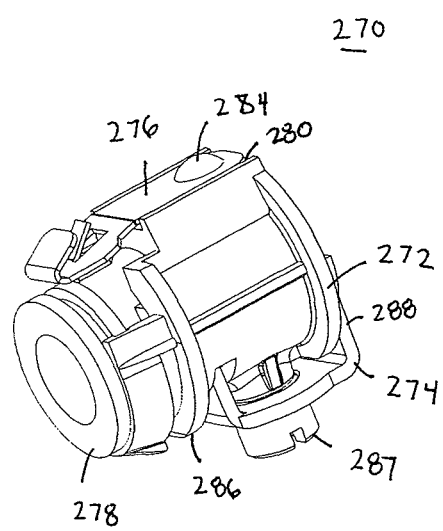
FIG. 29 is a perspective view of the connector assembly of FIG. 28.

FIGS. 28 through 33 illustrate yet another embodiment of the present invention. Referring to FIGS. 28 and 29, connector assembly 270 includes connector body 272, clamp member 274, spring clip 276, and insulator 278. Connector body 272 includes a bridge portion 280 having a generally planar surface separating a pair of longitudinally extending walls 282. A fastener 284 secures spring clip 276 to connector body 272. Walls 282 prevent spring clip 276 from rotation about fastener 284. A radially outwardly extending flange 286 which functions as a stop to limit the degree to which connector body 272 may be inserted through the knock-out hole of electrical box 12.

Figure 30:
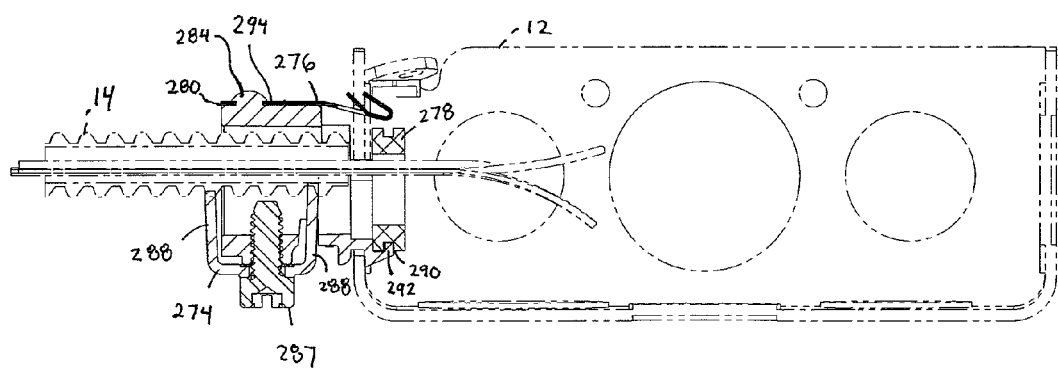
FIG. 30 is a cross-sectional view of the connector assembly of FIG. 28 as attached to an electrical box and cable end.

Clamp member 274 is shown as a generally C-shaped element being secured to connector body 272 by a threaded fastener 287. Clamp member has a pair of arms 288 having ends 289 configured for engagement with any desired flexible metal conduit and/or armored or metal clad cable. One of the arms 288 is received through an aperture in the connector body with the other arm being externally positioned relative to the connector body 272. As shown in FIG. 30, threaded fastener 287 is received within an internally threaded portion of connector body 272. During assembly, the threaded fastener 287 is rotated to bias the clamp member 274 into engagement with the conduit or cable.

FIG. 30 is a cross-sectional view of the connector assembly 270 as attached to electrical box 12. Insulator 278 which is of electrically insulative material and includes an annular groove 290 adapted to engage a corresponding tongue 292 within connector body 272. In the illustrated embodiment, insulator 278 is inserted into a generally u-shaped receptacle and is prevented from substantial movement by contact between tongue 292 and groove 290. Insulator 278 is held within connector body 272 by a free end of spring clip 276.

In FIG. 30, the head of fastener 184 is shown in an deformed state, such as after an orbital riveting process described above. Fastener 184 is formed as a boss extending from the planar surface of bridge portion 280. The boss is cast-in-place and thus integral to the connector body 272 and is adapted to be deformed via an orbital riveting process to securely fasten spring clip 276 to connector body 272. A variety of other fasteners, such as threaded fasteners, could be utilized to secure spring clip 276 to connector body 272 in alternative embodiments of the invention.

Figure 31:
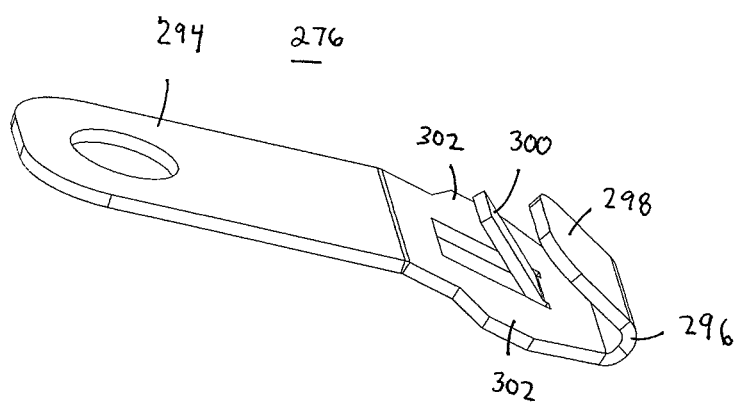
FIG. 31 is a perspective view of the spring clip of the connector assembly of FIG. 28.

Spring clip 276 is shown in FIG. 31 and includes a mounting portion 294 and a free end 296. Mounting portion 294 can be characterized as the second end of spring clip 276. Mounting portion 294 is secured as bridge portion 280 (as shown in FIG. 30). Free end 296 includes a hook structure including a hook end 298 and a tab 300. A pair of tapered wing portions 302 provide additional electrical continuity between spring clip 276 and the electrical box 12. Free end 296 of spring clip 276 is positioned to retain insulator 278 within the connector body 272.

Figure 32:
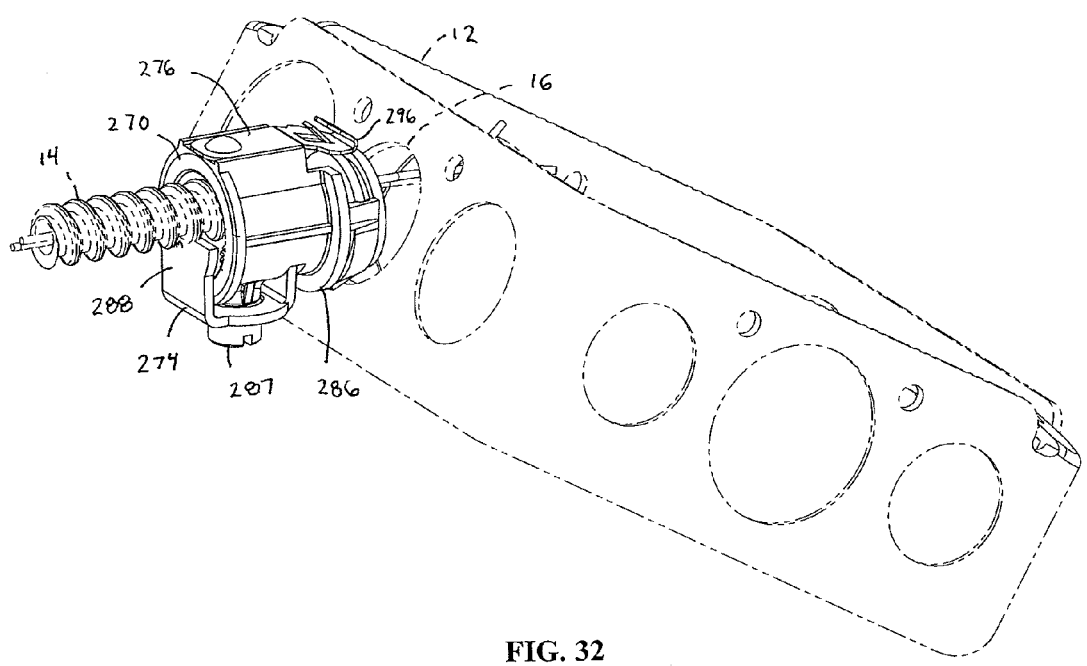
FIG. 32 depicts a method of securing the electrical connector assembly of FIG. 28 to an electrical box.

FIG. 32 depicts insertion of connector assembly 270 into electrical box 12. A lower lug (similar to lug 45) is initially inserted to engage a lower edge portion of hole 16 and connector body 272 is then rotated generally about the lower edge portion. As the free end 296 of spring clip 276 engages an upper edge portion of hole 16, spring clip 276 deflects toward insulator 278. Upon full insertion spring clip 276 retracts and engages inner and outer surfaces of the electrical box 12.

Figure 33:
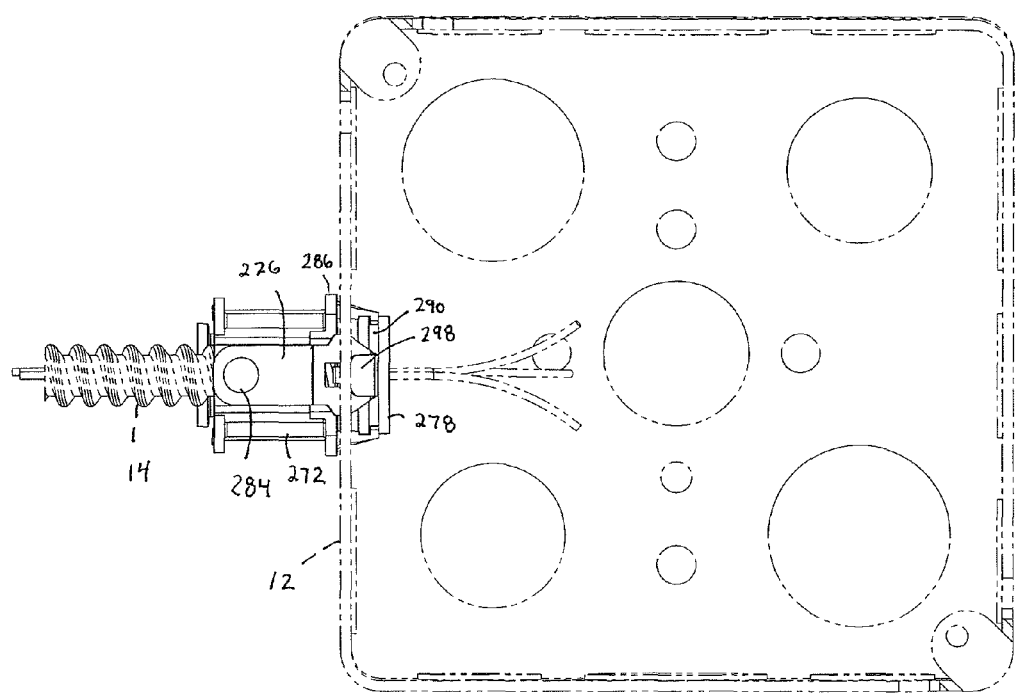
FIG. 33 is a top plan view of the electrical connector assembly and electrical box of FIG. 32 upon full insertion.

FIG. 33 is a top view of the connector assembly 270 post-connected to electrical box 12.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. An electrical connector assembly for securing an electrical cable to an electrical box comprising:
    a connector body having an inlet end portion and an outlet end portion and a bore therebetween;
    an insulator retained within a receptacle at the outlet end portion of said connector body, said insulator including a grooved portion which engages a tongue portion of the connector body, wherein the insulator is side-loaded into the receptacle in a direction generally perpendicular to a longitudinal axis of the connector body and wherein upon insertion of the insulator into the receptacle the tongue portion of the connector body prevents the insulator from displacement in a direction along the longitudinal axis of the connector body; and a spring clip secured by a fastener to said connector body, said spring clip defining a pair of free ends, with a first spring end extending away from the fastener toward the insulator, and with said first spring end engaging an inner surface of the electrical box to retain the connector body to the electrical box, and with a second spring end either being coupled directly to the connector body or extending into the connector body at the inlet end portion with said second spring end retaining the cable within the connector body.

2. The connector assembly of claim 1 wherein the insulator defines a cable stop which limits further movement of the cable within the connector body.

3. The connector assembly of claim 1 wherein the receptacle is generally U-shaped and the tongue portion includes an annular segment for engaging the grooved portion of the insulator.

4. The connector assembly of claim 3 wherein the grooved portion is annular and extends around the insulator.

5. The connector assembly of claim 1 wherein the spring clip extends beyond at least a portion of the insulator, said spring clip tending to retain the insulator within the receptacle.

6. The connector assembly of claim 1 wherein the first end of the spring clip includes a hook structure for engaging an inner surface of the electrical box.

7. The connector assembly of claim 6 wherein the first end also engages an outer surface of the electrical box.

8. The connector assembly of claim 7 wherein the hook structure includes a hook end of the spring clip and a tab positioned away from said hook end, with said hook end engaging the inner surface of the electrical box and with said tab engaging the outer surface of the electrical box.

9. The connector assembly of claim 1 wherein the fastener is at least one rivet.

10. An electrical connector assembly for securing an electrical cable to an electrical box comprising:
a connector body having an inlet end portion and an outlet end portion and a bore therebetween;
an insulator retained at the outlet end portion of said connector body; and
a spring clip secured by a fastener to said connector body, said spring clip defining a pair of free ends, with a first spring end extending away from the fastener toward the insulator, and with said first spring end engaging an inner surface of the electrical box to retain the connector body to the electrical box, and with a second spring end either being coupled directly to the connector body or extending into the connector body at the inlet end portion with said second spring end retaining the cable within the connector body, and
at least two tapered alignment ribs on said outlet end portion, with said alignment ribs engaging an inner surface of a knock-out hole, and with said alignment ribs tapering from a narrower width near the outlet end portion to a wider width away from the outlet end portion.

11. The connector assembly of claim 1 wherein the spring clip has a highly conductive coating selected from the group including: silver, tin, zinc and copper.

12. The connector assembly of claim 1 wherein the second end of the spring clip is secured to an external surface of the connector body.

13. The connector assembly of claim 12 wherein the external surface includes a generally planar portion for engaging a generally planar portion of the spring clip and at least one wall for limiting rotation of the spring clip upon the external surface.

14. The connector assembly of claim 1 further comprising:
a clamp for securing the cable to the connector body.

15. The connector assembly of claim 14 wherein the clamp includes a C-shaped element which is threadedly secured to the connector assembly.

16. The connector assembly of claim 14 wherein the clamp includes a curved cover adapted to engage outer surfaces of the cable.

17. The connector assembly of claim 16 wherein the cover includes an extension tab adapted to be inserted into an aperture of the connector body.

18. An electrical connector assembly for securing an electrical conductor to an electrical box comprising:
a connector body having an inlet end portion and an outlet end portion and a bore therebetween;
an insulator received into a side-access receptacle at the outlet end portion, said insulator including a grooved portion which engages a tongue portion of the connector body, wherein the insulator is side-loaded into the connector body in a direction generally perpendicular to a longitudinal axis of the connector body and wherein upon insertion of the insulator into the receptacle, the tongue portion of the connector body prevents the insulator from displacement in a direction along the longitudinal axis of the connector body; and
a spring clip secured by a fastener to said connector body, said spring clip having a first free end extending away from the fastener and spanning an open portion of the connector body, with said spring clip tending to retain the insulator within the receptacle.

19. The connector assembly of claim 18 wherein the first free end includes a hook structure for engaging an inner surface of the electrical box.

20. The connector assembly of claim 18 with the spring clip being secured at a second end to the connector body.

21. The connector assembly of claim 20 wherein the spring clip is secured at an external surface of the connector body which includes a generally planar portion for engaging a generally planar portion of the spring clip and at least one wall for limiting rotation of the spring clip upon the external surface.

22. The connector assembly of claim 18 further comprising:
a clamp for securing the cable to the connector body.

23. The connector assembly of claim 22 wherein the clamp includes a C-shaped element which is threadedly secured to the connector assembly.

24. The connector assembly of claim 22 wherein the clamp includes a curved cover adapted to engage outer surfaces of the cable.

25. The connector assembly of claim 24 wherein the cover includes an extension tab adapted to be inserted into an aperture of the connector body.

* * * * *